US008866156B2

(12) United States Patent
Yamada et al.

(10) Patent No.: US 8,866,156 B2
(45) Date of Patent: Oct. 21, 2014

(54) SILICON CARBIDE SEMICONDUCTOR DEVICE AND METHOD FOR MANUFACTURING SAME

(71) Applicant: Sumitomo Electric Industries, Ltd., Osaka (JP)

(72) Inventors: Shunsuke Yamada, Osaka (JP); Hideto Tamaso, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/895,848

(22) Filed: May 16, 2013

(65) Prior Publication Data

US 2013/0341646 A1  Dec. 26, 2013

Related U.S. Application Data

(60) Provisional application No. 61/662,778, filed on Jun. 21, 2012.

(30) Foreign Application Priority Data

Jun. 21, 2012 (JP) ................................. 2012-139385

(51) Int. Cl.
| H01L 21/44 | (2006.01) |
| H01L 29/94 | (2006.01) |
| H01L 31/0312 | (2006.01) |
| H01L 29/16 | (2006.01) |
| H01L 21/3205 | (2006.01) |

(52) U.S. Cl.
CPC ...... H01L 29/1608 (2013.01); H01L 21/32053 (2013.01); *Y10S 438/931* (2013.01)
USPC ...... 257/77; 257/384; 257/754; 257/E21.054; 257/E21.605; 438/571; 438/586; 438/597; 438/931

(58) Field of Classification Search
USPC ............ 257/77, 384, 754, E21.054, E21.605; 438/571, 586, 597, 931
See application file for complete search history.

(56) References Cited

U.S. PATENT DOCUMENTS

| 5,980,265 | A | * | 11/1999 | Tischler | ............................ | 438/93 |
| 7,875,545 | B2 | * | 1/2011 | Ward et al. | ..................... | 438/602 |
| RE42,423 | E | * | 6/2011 | Kordesch et al. | ............. | 257/198 |
| 2012/0319135 | A1 | | 12/2012 | Tamaso | | |
| 2013/0062624 | A1 | * | 3/2013 | Tsuchiya et al. | ................. | 257/77 |

FOREIGN PATENT DOCUMENTS

| JP | 07-099169 A | 4/1995 |
| JP | 2006-024880 | 1/2006 |

(Continued)

OTHER PUBLICATIONS

International Search Report and Written Opinion in International Application No. PCT/JP2013/061917 dated Aug. 6, 2013.

*Primary Examiner* — Thanh V Pham
(74) *Attorney, Agent, or Firm* — Venable LLP; Michael A. Sartori

(57) ABSTRACT

A silicon carbide semiconductor device includes a silicon carbide substrate and a contact electrode. The silicon carbide substrate includes an n type region and a p type region that makes contact with the n type region. The contact electrode makes contact with the n type region and the p type region. The contact electrode contains Ni atoms and Si atoms. The number of the Ni atoms is not less than 87% and not more than 92% of the total number of the Ni atoms and the Si atoms. Accordingly, there can be provided a silicon carbide semiconductor device, which can achieve ohmic contact with an n type impurity region and can achieve a low contact resistance for a p type impurity region, as well as a method for manufacturing such a silicon carbide semiconductor device.

5 Claims, 5 Drawing Sheets

(56) References Cited

FOREIGN PATENT DOCUMENTS

| | | |
|---|---|---|
| JP | 2006-202883 | 8/2006 |
| JP | 2009-200326 | 9/2009 |
| JP | 2011-176183 | 9/2011 |
| JP | 2012-099598 | 5/2012 |

* cited by examiner

SILICON CARBIDE SEMICONDUCTOR DEVICE AND METHOD FOR MANUFACTURING SAME

BACKGROUND OF THE INVENTION

1. Field of the Invention

The present invention relates to a silicon carbide semiconductor device and a method for manufacturing the silicon carbide semiconductor device, more particularly, a silicon carbide semiconductor device having a contact electrode and a method for manufacturing such a silicon carbide semiconductor device.

2. Description of the Background Art

In recent years, a silicon carbide substrate has begun to be used for manufacturing of a semiconductor device. Silicon carbide has a band gap larger than that of silicon. Hence, a semiconductor device employing a silicon carbide substrate advantageously has a high breakdown voltage, low on-resistance, and properties less deteriorated in a high temperature environment.

For example, Japanese Patent Laying-Open No. 7-99169 discloses a method for forming an electrode that makes ohmic contact with an n type silicon carbide substrate. According to this method, a NiSi (nickel silicide) alloy layer, which contains Ni (nickel) at a composition ratio of 33 atomic % to 67 atomic %, is formed on the n type silicon carbide substrate, and thereafter heat treatment is provided thereto, thereby forming an electrode that makes ohmic contact with the n type silicon carbide substrate.

Although the electrode manufactured using the method described in Japanese Patent Laying-Open No. 7-99169 can make ohmic contact with the n type silicon carbide substrate, the electrode has a large contact resistance for a p type silicon carbide substrate.

SUMMARY OF THE INVENTION

Accordingly, the present invention has its object to provide a silicon carbide semiconductor device, which can achieve ohmic contact with an n type impurity region and can achieve a low contact resistance for a p type impurity region, as well as a method for manufacturing such a silicon carbide semiconductor device.

A silicon carbide semiconductor device according to the present invention includes a silicon carbide substrate and a contact electrode. The silicon carbide substrate includes an n type region and a p type region that makes contact with the n type region. The contact electrode makes contact with the n type region and the p type region. The contact electrode contains Ni atoms and Si atoms. The number of the Ni atoms is not less than 87% and not more than 92% of a total number of the Ni atoms and the Si atoms.

According to the silicon carbide semiconductor device in the present invention, the number of the Ni atoms is not less than 87% and not more than 92% of the total number of the Ni atoms and the Si atoms in the contact electrode. Accordingly, the contact electrode can make ohmic contact with the n type region formed in the silicon carbide substrate, and can achieve a low contact resistance for the p type region formed in the silicon carbide substrate.

Preferably, the above-described silicon carbide semiconductor device further includes a protecting electrode. The contact electrode has a first surface that makes contact with the silicon carbide substrate, and a second surface opposite to the first surface. The protecting electrode makes contact with the contact electrode at the second surface. The number of the Si atoms in the second surface is larger than the number of the Si atoms in the first surface.

According to the above-described silicon carbide semiconductor device, the number of the Si atoms in the second surface is larger than the number of the Si atoms in the first surface. Accordingly, the Si atoms can be bonded to C atoms to suppress generation of C atoms. As a result, adhesion can be improved between the contact electrode and the protecting electrode.

Preferably in the above-described silicon carbide semiconductor device, the number of the Si atoms in the second surface is larger than the number of the Ni atoms in the second surface. Accordingly, the Ni atoms can be suppressed from being oxidized.

A method for manufacturing a silicon carbide semiconductor device in the present invention includes the following steps. There is prepared a silicon carbide substrate including an n type region and a p type region that makes contact with the n type region. A contact electrode is formed in contact with the n type region and the p type region. The contact electrode is annealed after forming the contact electrode. The contact electrode contains Ni atoms and Si atoms, and the number of the Ni atoms is not less than 87% and not more than 92% of a total number of the Ni atoms and the Si atoms.

According to the method for manufacturing the silicon carbide semiconductor device in the present invention, the contact electrode contains Ni atoms and Si atoms, and the number of the Ni atoms is not less than 87% and not more than 92% of the total number of the Ni atoms and the Si atoms. Accordingly, the contact electrode can make ohmic contact with the n type region formed in the silicon carbide substrate, and can achieve a low contact resistance for the p type region formed in the silicon carbide substrate.

Preferably in the method for manufacturing the silicon carbide semiconductor device, the step of forming the contact electrode includes the following steps. A first layer, which contains the Si atoms and the Ni atoms, is formed on the silicon carbide substrate such that the number of the Ni atoms becomes larger than the number of the Si atoms. A second layer, which contains the Si atoms and the Ni atoms, is formed on the first layer such that the number of the Si atoms becomes larger than the number of the Ni atoms.

According to the above-described method for manufacturing the silicon carbide semiconductor device, the number of the Si atoms becomes larger than the number of the Ni atoms in the second layer that faces the protecting electrode. Accordingly, the Si atoms can be bonded to C atoms to suppress generation of C atoms. As a result, adhesion can be improved between the contact electrode and the protecting electrode.

As apparent from the description above, according to the present invention, there can be provided a silicon carbide semiconductor device, which can achieve ohmic contact with an n type impurity region and can achieve a low contact resistance for a p type impurity region, as well as a method for manufacturing such a silicon carbide semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
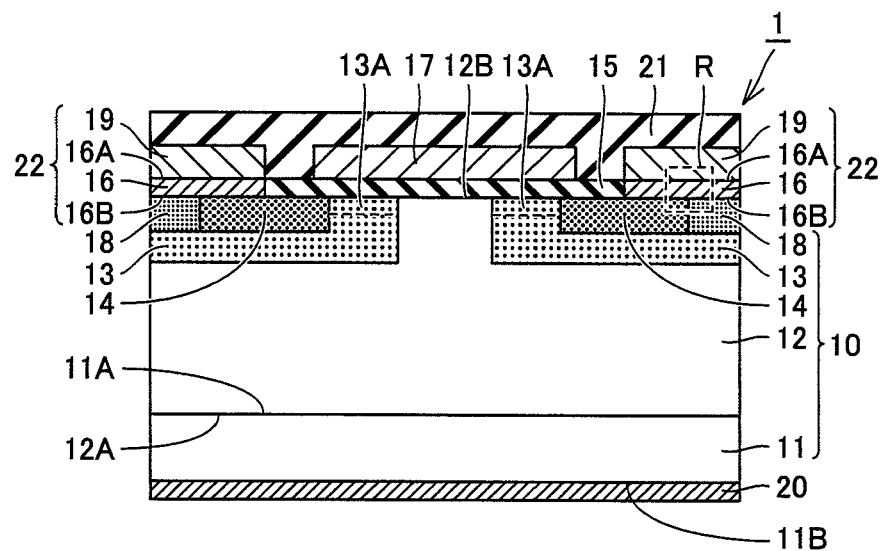
FIG. 1 is a schematic cross sectional view showing a configuration of a silicon carbide semiconductor device according to one embodiment of the present invention.

The following describes one embodiment of the present invention with reference to figures. It should be noted that in the below-mentioned figures, the same or corresponding portions are given the same reference characters and are not described repeatedly.

Described first is a configuration of a MOSFET 1 (Metal Oxide Semiconductor Field Effect Transistor) serving as a silicon carbide semiconductor device in the embodiment of the present invention.

Referring to FIG. 1, MOSFET 1 includes a silicon carbide substrate 10. Silicon carbide substrate 10 includes an n+ substrate 11, an n− SiC layer 12, p bodies 13, n+ source regions 14, and p+ regions 18.

N+ substrate 11 is a substrate made of silicon carbide (SiC) and having n type conductivity. N+ substrate 11 contains an n type impurity (impurity having n type conductivity) such as N (nitrogen) at a high concentration.

N− SiC layer 12 is a semiconductor layer made of SiC and having n type conductivity. N− SiC layer 12 is formed on one main surface 11A of n+ substrate 11 to have a thickness of, for example, approximately 10 μm. N− SiC layer 12 contains an n type impurity such as N (nitrogen) at a concentration lower than the concentration of the n type impurity in n+ substrate 11, for example, at a concentration of $5 \times 10^{15}$ cm$^{-3}$.

The pair of p bodies 13 have p type conductivity. The pair of p bodies 13 are formed away from each other in n− SiC layer 12 so as to include a second main surface 12B (substrate surface) thereof opposite to its first main surface 12A at the n+ substrate 11 side. Each of p bodies 13 contains a p type impurity such as Al (aluminum) or B (boron) at a concentration lower than the concentration of the n type impurity in n+ substrate 11, for example, at a concentration of $1 \times 10^{17}$ cm$^{-3}$.

Each of n+ source regions 14 is an n type region having n type conductivity. N+ source region 14 is formed in each of the pair of p bodies 13 so as to include second main surface 12B and be surrounded by p body 13. Each of n+ source regions 14 contains an n type impurity such as P (phosphorus) at a concentration higher than the concentration of the n type impurity in n− SiC layer 12, for example, at a concentration of $1 \times 10^{20}$ cm$^{-3}$.

Each of p+ regions 18 is a p type region having p type conductivity. When viewed from n+ source region 14 formed in one of the pair of p bodies 13, each of p+ regions 18 is formed at a side opposite to n+ source region 14 formed in the other p body 13, so as to include second main surface 12B. Each of p+ regions 18 contains a p type impurity such as Al or B at a concentration higher than the concentration of the p type impurity in p body 13, for example, at a concentration of $1 \times 10^{20}$ cm$^{-3}$.

Further, MOSFET 1 includes a gate oxide film 15 (insulating film) serving as a gate insulating film, a gate electrode 17, a pair of contact electrodes 16 (source contact electrodes), protecting electrodes 19, a drain electrode 20, and a passivation film 21.

Gate oxide film 15 is formed on and in contact with second main surface 12B of n− SiC layer 12 so as to extend from a location above the upper surface of one n+ source region 14 to a location above the upper surface of the other n+ source region 14. Gate oxide film 15 preferably includes at least one of a silicon oxide film and a silicon nitride film, and is made of, for example, silicon dioxide ($SiO_2$).

Gate electrode 17 is disposed in contact with gate oxide film 15 so as to extend from a location above one n+ source region 14 to a location above the other n+ source region 14. Further, gate electrode 17 is made of a conductor such as polysilicon or Al.

Contact electrodes 16 are disposed in contact with second main surface 12B, extend from respective locations on the pair of n+ source regions 14 in the directions getting away from gate oxide film 15, and reach locations on p+ regions 18. Details of a configuration of each contact electrode 16 will be described later.

Each of protecting electrodes 19 is formed in contact with contact electrode 16, and is made of a conductor such as Al. Protecting electrode 19 is electrically connected to n+ source region 14 via contact electrode 16. Protecting electrode 19 and contact electrode 16 constitute a source electrode 22.

Drain electrode 20 is formed in contact with the other main surface 11B of n+ substrate 11 opposite to one main surface 11A on which n− SiC layer 12 is formed. This drain electrode 20 may have, for example, the same configuration as that of contact electrode 16 described above, or may be made of a different material capable of ohmic contact with n+ substrate 11, such as Ni (nickel). In this way, drain electrode 20 is electrically connected to n+ substrate 11.

Passivation film 21 is formed to extend from a location above one protecting electrode 19 to a location above the other protecting electrode 19 via a location above gate electrode 17. This passivation film 21 is made of, for example, $SiO_2$, and has a function of electrically insulating protecting electrode 19 and gate electrode 17 from an external component and protecting MOSFET 1.

Figure 2:
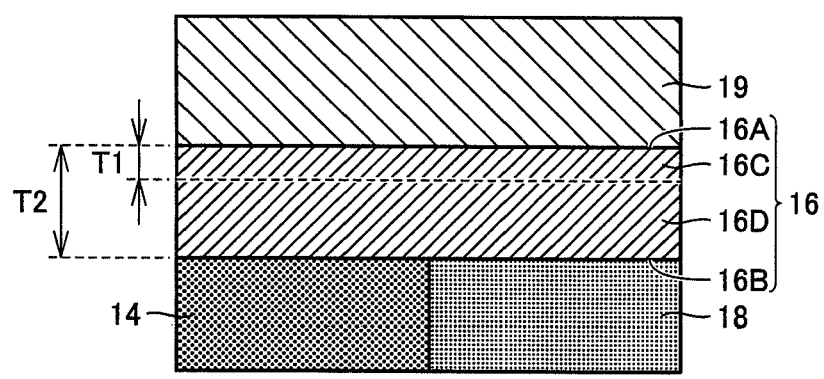
FIG. 2 is an enlarged cross sectional view of a region R in FIG. 1.

Referring to FIG. 2, the following describes details of a configuration of a region R of MOSFET 1 in FIG. 1.

Referring to FIG. 2, region R is a region including n+ source region 14, p+ region 18, contact electrode 16, and protecting electrode 19. P+ region 18 makes contact with n+ source region 14. Contact electrode 16 makes contact with n+ source region 14 and p+ region 18. Contact electrode 16 contains Ni atoms and Si atoms, and has a thickness T2 of, for example, 100 nm. Contact electrode 16 contains a compound having Ni—Si bonds, for example. The number of the Ni atoms is not less than 87% and not more than 92% of the total number of the Ni atoms and the Si atoms. It should be noted that contact electrode 16 may contain other elements such as carbon as long as contact electrode 16 contains Ni—Si as its main component. Further, the ratio of the number of the Ni atoms to the total number of the Ni atoms and the Si atoms can be measured using, for example, an EPMA (Electron Probe Micro Analyzer). The ratio of the Ni atoms is, for example, a value in the vicinity of the center of contact electrode 16 in the thickness direction.

Contact electrode 16 has a first surface 16B that makes contact with silicon carbide substrate 10, and a second surface 16A opposite to first surface 16B. Protecting electrode 19 makes contact with contact electrode 16 at second surface 16A.

Figure 3:
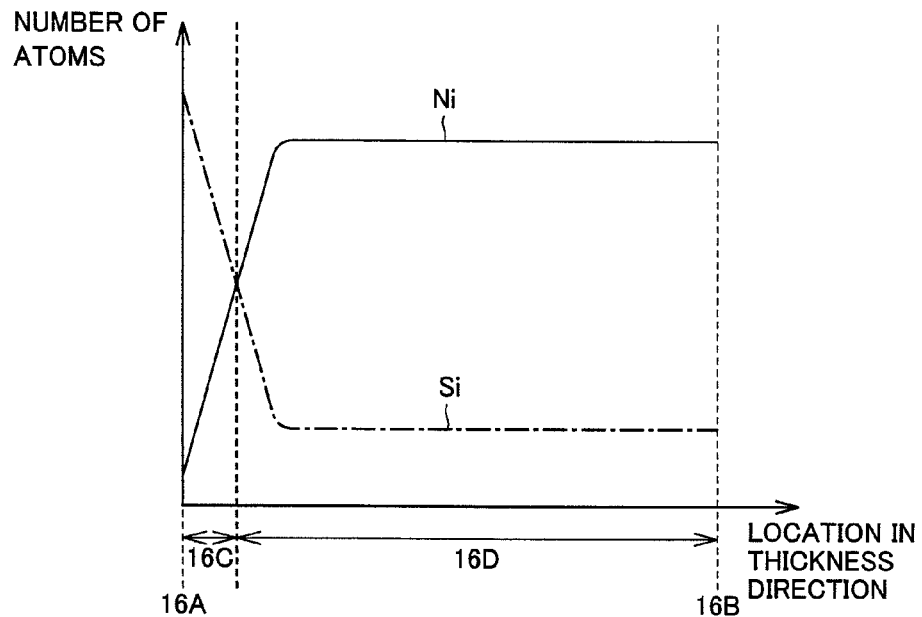
FIG. 3 shows a relation between the number of atoms in a contact electrode and a location in the thickness direction.

Referring to FIG. 2 and FIG. 3, the following describes distribution of the Ni atoms and the Si atoms in contact electrode 16. The right side of FIG. 3 corresponds to the silicon carbide substrate 10 side, whereas the left side of FIG. 3 corresponds to the protecting electrode 19 side. As shown in FIG. 3, in contact electrode 16, the number of the Si atoms in second surface 16A, which is an interface with protecting electrode 19, is preferably smaller than the number of the Si atoms in first surface 16B, which is an interface with silicon carbide substrate 10. Further, the number of the Si atoms is smaller than the number of the Ni atoms in first surface 16B of contact electrode 16, but the number of the Si atoms is preferably larger than the number of the Ni atoms in second surface 16A of contact electrode 16.

Thus, contact electrode 16 preferably has a first layer 16D in which the number of the Ni atoms is larger than the number of the Si atoms, and a second layer 16C in which the number of the Si atoms is larger than the number of the Ni atoms. Second layer 16C has a thickness T1 of, for example, approximately 10 nm.

The following describes an operation of MOSFET 1. When a voltage equal to or lower than a threshold value is applied to gate electrode 17, i.e., when it is in OFF state, p body 13 and n$^-$ SiC layer 12 disposed just below gate oxide film 15 are reverse-biased. Hence, it is in a non-conductive state. On the other hand, when gate electrode 17 is fed with a positive voltage, an inversion layer is formed in a channel region 13A near a location at which p body 13 makes contact with gate oxide film 15. As a result, n$^+$ source region 14 and n$^-$ SiC layer 12 are electrically connected to each other, whereby a current flows between source electrode 22 and drain electrode 20.

The following describes a method for manufacturing MOSFET 1 serving as the silicon carbide semiconductor device of the embodiment.

Figure 4:
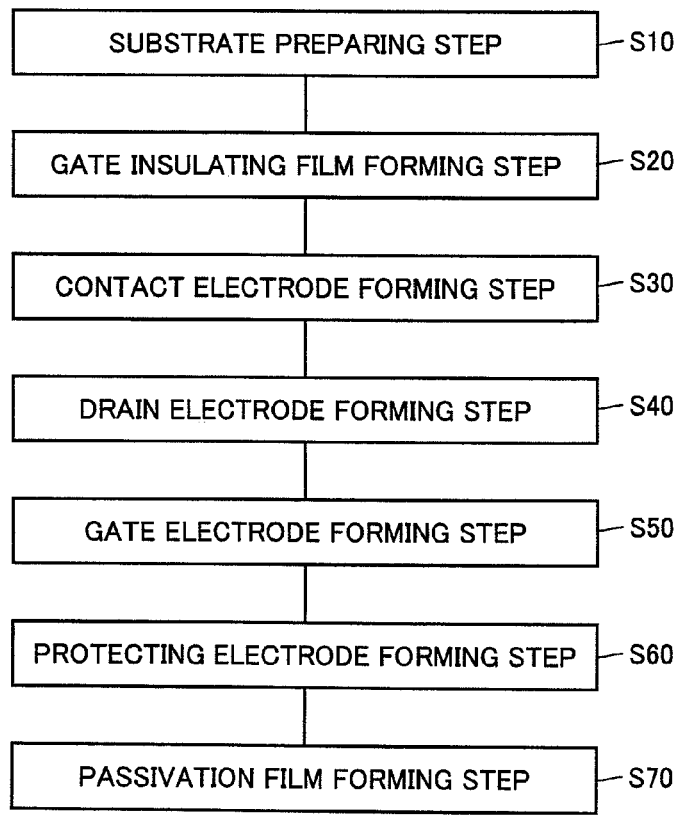
FIG. 4 is a flowchart schematically showing a method for manufacturing the silicon carbide semiconductor device according to the embodiment of the present invention.
Figure 5:
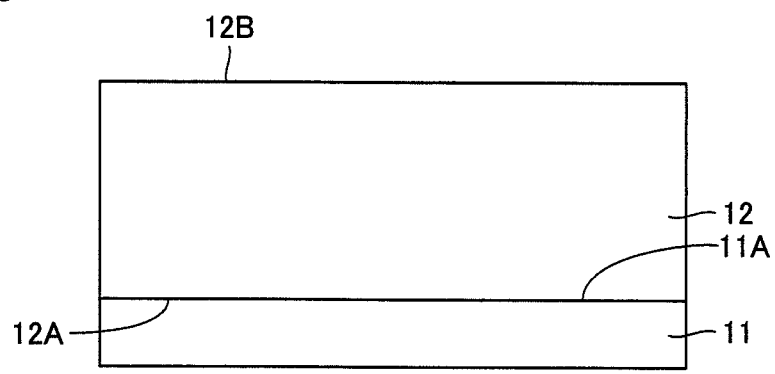
FIG. 5 is a schematic cross sectional view showing a first step in the method for manufacturing the silicon carbide semiconductor device according to the embodiment of the present invention.
Figure 6:
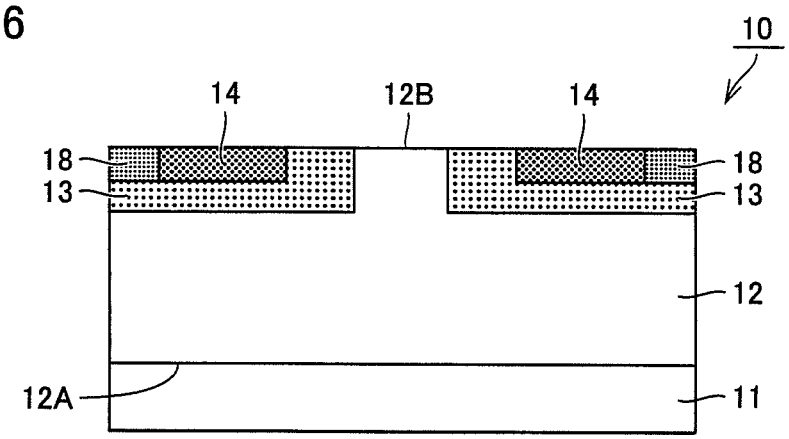
FIG. 6 is a schematic cross sectional view showing a second step in the method for manufacturing the silicon carbide semiconductor device according to the embodiment of the present invention.

Referring to FIG. 5 and FIG. 6, a substrate preparing step S10 (FIG. 4) is first performed to prepare silicon carbide substrate 10.

Specifically, first, n$^-$ SiC layer 12 is formed on one main surface 11A of n$^+$ SiC substrate 11 by means of epitaxial growth on n$^+$ SiC substrate 11. The epitaxial growth can be performed using, for example, a mixed gas of SiH$_4$ (silane) and C$_3$H$_8$ (propane) as a source material gas. In doing so, for example, N (nitrogen) is introduced as an n type impurity. In this way, n$^-$ SiC layer 12 can be formed which contains the n type impurity at a concentration lower than that of the n type impurity in n$^+$ SiC substrate 11.

Next, an oxide film made of SiO$_2$ is formed on second main surface 12B by means of a CVD (Chemical Vapor Deposition) method, for example. Then, a resist is applied onto the oxide film, and thereafter exposure and development are performed, thereby forming a resist film having an opening at a region in conformity with a desired shape of p body 13. Then, the oxide film is partially removed through, for example, RIE (Reactive Ion Etching) using the resist film as a mask, whereby a mask layer formed of an oxide film having an opening pattern is formed on n$^-$ SiC layer 12. Thereafter, the resist film is removed and ions of a p type impurity such as Al are implanted into n$^-$ SiC layer 12 using the mask layer as a mask, thereby forming p body 13 in n$^-$ SiC layer 12.

Next, the oxide film thus used as the mask is removed. Then, a mask layer is formed which has an opening at a region in conformity with a desired shape of n$^+$ source region 14. Using this mask layer as a mask, ions of an n type impurity such as P (phosphorus) are implanted into n$^-$ SiC layer 12, thereby forming n$^+$ source region 14. Next, a mask layer is formed which has an opening at a region in conformity with a desired shape of p$^+$ region 18. Using this mask layer as a mask, ions of a p type impurity such as Al or B are implanted into n$^-$ SiC layer 12, thereby forming p$^+$ region 18.

Next, heat treatment is performed to activate the impurities introduced by the above-described ion implantations. Specifically, n$^-$ SiC layer 12 having the ions implanted therein is heated in an Ar (argon) atmosphere at approximately 1700° C. for 30 minutes, for example. In this way, silicon carbide substrate 10 (FIG. 6) is prepared which includes n$^+$ source region 14 and p$^+$ region 18 that makes contact with n$^+$ source region 14.

Figure 7:
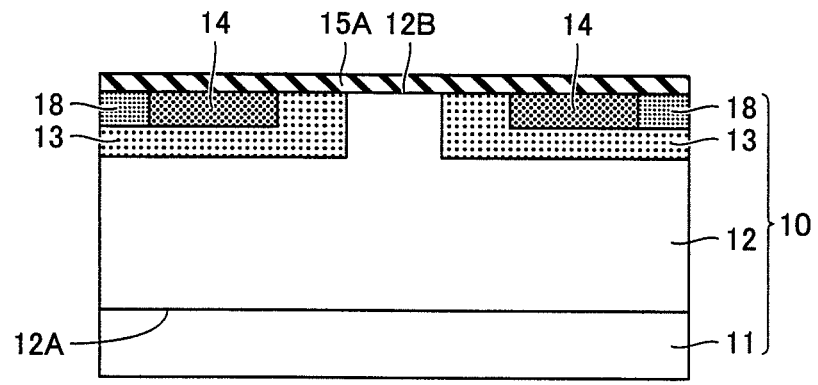
FIG. 7 is a schematic cross sectional view showing a third step in the method for manufacturing the silicon carbide semiconductor device according to the embodiment of the present invention.

Referring to FIG. 7, a gate insulating film forming step S20 (FIG. 4) is performed to form gate oxide film 15 (insulating film). Specifically, first, n$^+$ substrate 11, which is provided with n$^-$ SiC layer 12 including the desired ion implantation regions by performing the foregoing step, is thermally oxidized. The thermal oxidation can be performed by heating it in an oxygen atmosphere at approximately 1300° C. for approximately 40 minutes, for example. In this way, a thermal oxidation film 15A (having a thickness of approximately 50 nm, for example) made of silicon dioxide (SiO$_2$) is formed on second main surface 12B.

Next, a resist is applied onto thermal oxidation film 15A, and thereafter exposure and development are performed, thereby forming a resist film having an opening in conformity with a region in which contact electrode 16 (see FIG. 1) is to be formed. Then, using this resist film as a mask, the thermal oxidation film is partially removed by means of, for example, RIE. In this way, n$^+$ source region 14 and p$^+$ region 18 are exposed.

Figure 8:
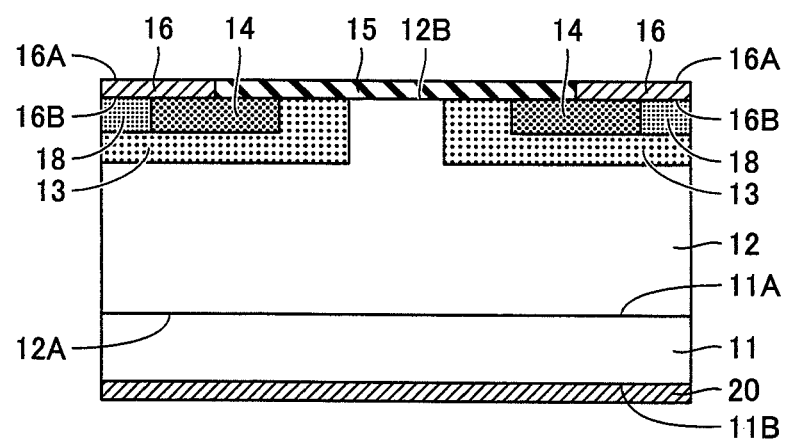
FIG. 8 is a schematic cross sectional view showing a fourth step in the method for manufacturing the silicon carbide semiconductor device according to the embodiment of the present invention.

Referring to FIG. 8, a contact electrode forming step S30 (FIG. 4) is performed.

Contact electrode 16 is formed on and in contact with n$^|$ source region 14 and p$^+$ region 18, which are exposed by the foregoing step, by means of a sputtering method, for example. Contact electrode 16 contains Ni atoms and Si atoms. Contact electrode 16 contains a compound having Ni—Si bonds, for example. The number of the Ni atoms is not less than 87% and not more than 92% of the total number of the Ni atoms and the Si atoms. It should be noted that contact electrode 16 may contain other elements such as carbon as long as contact electrode 16 contains Ni—Si as its main component.

Contact electrode 16 is formed at a film formation rate of, for example, approximately 100 Å per minute. Contact electrode 16 is preferably formed at a film formation rate of, for example, approximately 500 Å or less per minute. This is likely to suppress damage on silicon carbide substrate 10.

The formation of contact electrode 16 is performed using, for example, the following method. For example, first layer 16D (see FIG. 2), which contains the Si atoms and the Ni atoms, is first formed on silicon carbide substrate 10 such that the number of the Ni atoms becomes larger than the number of the Si atoms. For example, a sputtering condition for Ni (first Ni sputtering condition) and a sputtering condition for Si (first Si sputtering condition) are selected such that a sputtering rate of Ni becomes larger than that of Si. With the first Ni sputtering condition and the first Si sputtering condition, Ni and Si are simultaneously sputtered. In this way, first layer 16D in which the number of the Ni atoms is larger than the number of the Si atoms is formed in contact with $n^+$ source region 14 and $p^+$ region 18.

Next, the sputtering condition for Ni and the sputtering condition for Si are changed. Thereafter, second layer 16C (see FIG. 2), which contains the Si atoms and the Ni atoms, is formed on first layer 16D such that the number of the Si atoms becomes larger than the number of the Ni atoms. Specifically, a sputtering condition for Ni (second Ni sputtering condition) and a sputtering condition for Si (second Si sputtering condition) are selected such that a sputtering rate of Si becomes larger than that of Ni. With the second Ni sputtering condition and the second Si sputtering condition, Ni and Si are simultaneously sputtered. In this way, second layer 16C in which the number of the Si atoms is larger than the number of the Ni atoms is formed on first layer 16D. Thus, contact electrode 16 including first layer 16D and second layer 16C is formed in contact with $n^+$ source region 14 and $p^+$ region 18. It should be noted that the formation of contact electrode 16 may be performed by means of, for example, a deposition method.

Referring to FIG. 3, the following describes the distribution of the Ni atoms and the Si atoms in contact electrode 16. As shown in FIG. 3, in contact electrode 16, the number of the Si atoms in second surface 16A, which is an interface with protecting electrode 19, is preferably smaller than the number of the Si atoms in first surface 16B, which is an interface with silicon carbide substrate 10. Further, the number of the Si atoms is smaller than the number of the Ni atoms in first surface 16B of contact electrode 16, but the number of the Si atoms is preferably larger than the number of the Ni atoms in second surface 16A of contact electrode 16.

After forming contact electrode 16, a step of annealing contact electrode 16 is performed. Accordingly, contact electrode 16 is alloyed, thus forming contact electrode 16 in contact with silicon carbide substrate 10 with a low resistance. Specifically, in an inert gas atmosphere such as Ar, contact electrode 16 and silicon carbide substrate 10 are heated at a temperature of, for example, not less than 950° C. and not more than 1200° C., for example, at a temperature of 1000° C. for not less than 30 seconds and not more than 300 seconds, for example.

Next, a drain electrode forming step S40 (FIG. 4) is performed to form drain electrode 20 on the opposite surface of silicon carbide substrate 10 to second main surface 12B. For example, a Ni layer is formed on the opposite surface by sputtering Ni, and then the Ni layer is annealed to form drain electrode 20. It should be noted that instead of the Ni layer, the above-described layer containing Ni atoms and Si atoms may be used.

Referring to FIG. 1 again, a gate electrode forming step S50 (FIG. 4) is performed to form gate electrode 17. In this step, for example, gate electrode 17, which is made of a conductor such as polysilicon or Al, is formed in contact with gate oxide film 15 so as to extend from a location above one $n^+$ source region 14 to a location above the other $n^+$ source region 14. When polysilicon is employed as the material of the gate electrode, the polysilicon can be adapted to contain P (phosphorus) at a high concentration exceeding $1 \times 10^{20}$ cm$^{-3}$.

Next, a protecting electrode forming step S60 (FIG. 4) is performed to form protecting electrode 19. In this step, for example, a deposition method is employed to form protecting electrode 19, which is made of a conductor such as Al, on second surface 16A of contact electrode 16. In this way, source electrode 22 is completed. It should be noted that a layer containing C (carbon) and formed in the vicinity of second surface 16A of contact electrode 16 is preferably partially or entirely removed by etching second surface 16A of contact electrode 16 before forming protecting electrode 19. The layer containing C can be removed by means of dry etching that employs Ar or $CH_4$, or wet etching that employs an ammonia-hydrogen peroxide solution, for example. Accordingly, adhesion can be improved between contact electrode 16 and protecting electrode 19.

Next, a passivation film forming step S70 (FIG. 4) is performed to form passivation film 21. In this step, passivation film 21 made of, for example, $SiO_2$ is formed to extend from a location above one protecting electrode 19 to a location above the other protecting electrode 19 via a location above gate electrode 17. This passivation film 21 can be formed using, for example, the CVD method. In this way, MOSFET 1 is completed.

It should be noted that a configuration may be employed in which n type conductivity and p type conductivity in the above-described embodiment are replaced with each other. It should be also noted that the description above has illustrated the planar type MOSFET as one example of the silicon carbide semiconductor device of the present invention but the present invention is not limited to this. For example, the silicon carbide semiconductor device may be a trench type MOSFET, an IGBT (Insulated Gate Bipolar Transistor), or the like, for example.

The following describes function and effect of the present embodiment.

According to MOSFET 1 in the present embodiment, the number of the Ni atoms is not less than 87% and not more than 92% of the total number of the Ni atoms and the Si atoms in contact electrode 16. Accordingly, contact electrode 16 can make ohmic contact with $n^+$ source region 14 formed in silicon carbide substrate 10, and can achieve a low contact resistance for $p^+$ region 18 formed in silicon carbide substrate 10.

According to MOSFET 1 in the present embodiment, the number of the Si atoms in second surface 16A is larger than the number of the Si atoms in first surface 16B. Accordingly, the Si atoms can be bonded to C atoms to suppress generation of C atoms. As a result, adhesion can be improved between contact electrode 16 and protecting electrode 19.

According to MOSFET 1 in the present embodiment, the number of the Si atoms in second surface 16A is larger than the number of the Ni atoms in second surface 16A. Accordingly, the Ni atoms can be suppressed from being oxidized.

According to the method for manufacturing MOSFET 1 in the present embodiment, contact electrode 16 contains the Ni atoms and the Si atoms, and the number of the Ni atoms is not less than 87% and not more than 92% of the total number of the Ni atoms and the Si atoms. Accordingly, contact electrode 16 can make ohmic contact with $n^+$ source region 14 formed in silicon carbide substrate 10, and can achieve a low contact resistance for $p^+$ region 18 formed in silicon carbide substrate 10.

According to the method for manufacturing MOSFET 1 in the present embodiment, contact electrode 16 is formed such that the number of the Si atoms becomes larger than the number of the Ni atoms in second layer 16C that faces protecting electrode 19. Accordingly, the Si atoms can be bonded to C atoms to suppress generation of C atoms. As a result, adhesion can be improved between contact electrode 16 and protecting electrode 19.

EXAMPLE

The following describes an example of the present invention. First, a silicon carbide substrate having a p type impurity region formed therein and a silicon carbide substrate having an n type impurity region formed therein were prepared. A contact electrode was formed in contact with the p type impurity region formed in the silicon carbide substrate, and a contact electrode was formed in contact with the n type impurity region formed in the silicon carbide substrate. After forming the contact electrodes, the silicon carbide substrates and the contact electrodes were annealed. The annealing was performed under the conditions described in the embodiment. Five types of contact electrodes, which were different in ratio of the Ni atoms to the total of the Si atoms and the Ni atoms therein, were formed on each of the silicon carbide substrate having the p type impurity region and the silicon carbide substrate having the n type impurity region.

Next, contact resistance of each contact electrode with each of the p type impurity region and the n type impurity region formed in each silicon carbide substrate was measured. The contact resistance was measured by means of a TLM (Transmission Line Model) method.

Figure 9:
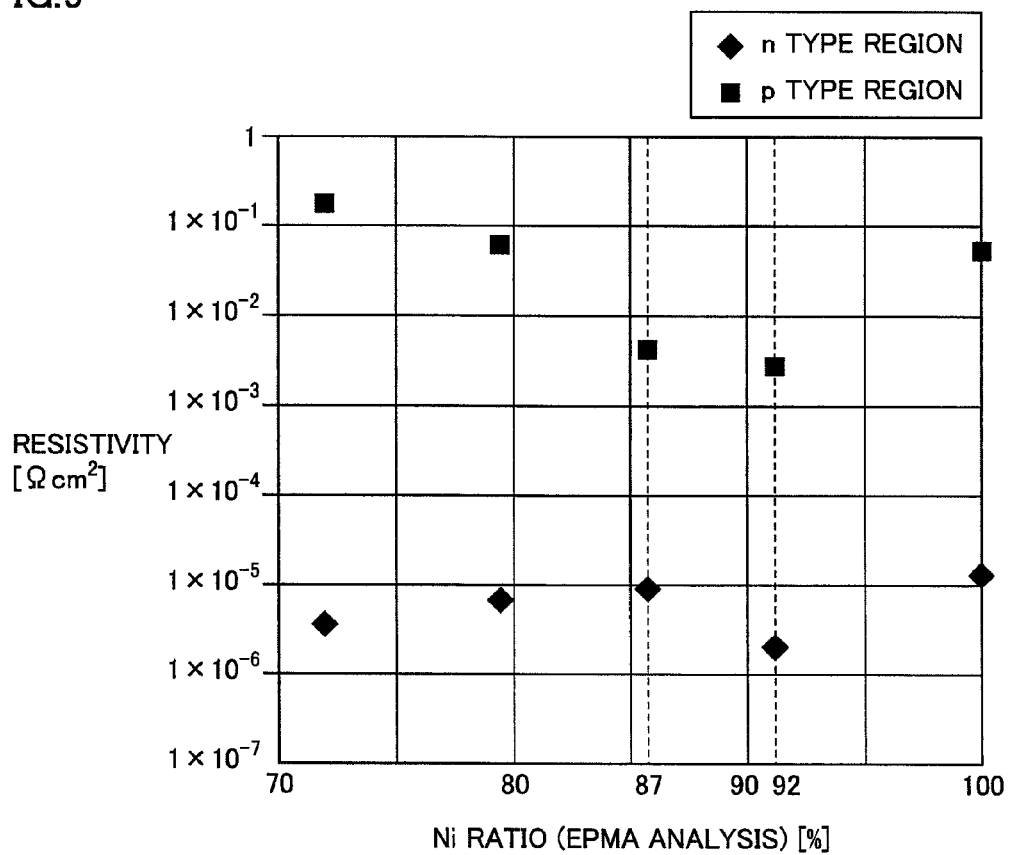
FIG. 9 shows a relation between a composition ratio of Ni and a contact resistance.

Referring to FIG. 9, the following describes a relation between the contact resistance and the ratio of the Ni atoms. It should be noted that the ratio of the Ni atoms was measured by means of EPMA analysis. As shown in FIG. 9, it was confirmed that when the ratio of the Ni atoms was not less than 87% and not more than 92%, the contact resistance between the p type impurity region and the contact electrode was drastically reduced. When the ratio of the Ni atoms was in this range, the contact resistance (resistivity) was approximately not less than $1\times10^{-3}$ $\Omega cm^2$ and not more than $1\times10^{-2}$ $\Omega cm^2$. On the other hand, when the ratio of the Ni atoms was in the range of not less than 87% and not more than 92%, the contact resistance between the n type impurity region and the contact electrode was approximately not less than $1\times10^{-6}$ $\Omega cm^2$ and not more than $1\times10^{-5}$ $\Omega cm^2$. It was confirmed that the n type impurity region and the contact electrode made ohmic contact with each other.

Thus, it was proved that when the number of the Ni atoms is set at not less than 87% and not more than 92% of the total number of the Ni atoms and the Si atoms in the contact electrode, the contact electrode can make ohmic contact with the n type impurity region formed in the silicon carbide substrate and can achieve a low contact resistance for the p type impurity region formed in the silicon carbide substrate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
a silicon carbide substrate including an n type region and a p type region that makes contact with said n type region; and
a contact electrode that makes contact with said n type region and said p type region,
said contact electrode containing Ni atoms and Si atoms,
the number of said Ni atoms being not less than 87% and not more than 92% of a total number of said Ni atoms and said Si atoms.

2. The silicon carbide semiconductor device according to claim 1, wherein said contact electrode has a first surface that makes contact with said silicon carbide substrate, and a second surface opposite to said first surface,
the silicon carbide semiconductor device further comprising a protecting electrode that makes contact with said contact electrode at said second surface, the number of said Si atoms in said second surface being larger than the number of said Si atoms in said first surface.

3. The silicon carbide semiconductor device according to claim 2, wherein the number of said Si atoms in said second surface is larger than the number of said Ni atoms in said second surface.

4. A method for manufacturing a silicon carbide semiconductor device, comprising the steps of:
preparing a silicon carbide substrate including an n type region and a p type region that makes contact with said n type region;
forming a contact electrode in contact with said n type region and said p type region, said contact electrode containing Ni atoms and Si atoms, the number of said Ni atoms being not less than 87% and not more than 92% of a total number of said Ni atoms and said Si atoms; and
annealing said contact electrode after forming said contact electrode.

5. The method for manufacturing the silicon carbide semiconductor device according to claim 4, wherein
the step of forming said contact electrode includes the steps of:
forming a first layer, which contains said Si atoms and said Ni atoms, on said silicon carbide substrate such that the number of said Ni atoms becomes larger than the number of said Si atoms; and
forming a second layer, which contains said Si atoms and said Ni atoms, on said first layer such that the number of said Si atoms becomes larger than the number of said Ni atoms.

* * * * *